United States Patent [19]

Freeman, Jr. et al.

[11] 3,970,950

[45] July 20, 1976

[54] HIGH COMMON MODE REJECTION DIFFERENTIAL AMPLIFIER UTILIZING ENHANCEMENT DEPLETION FIELD EFFECT TRANSISTORS

[75] Inventors: Leo B. Freeman, Jr.; Robert J. Incerto, both of Poughkeepsie; Joseph A. Petrosky, Jr., Wappingers Falls, all of N.Y.

[73] Assignee: International Business Machines Corporation, Armonk, N.Y.

[22] Filed: Mar. 21, 1975

[21] Appl. No.: 560,919

[52] U.S. Cl. ............................ 330/30 D; 307/304; 330/35
[51] Int. Cl.² .................................... H03F 3/45
[58] Field of Search ............ 307/304; 330/30 D, 35

[56] References Cited
UNITED STATES PATENTS

| | | | |
|---|---|---|---|
| 3,375,457 | 3/1968 | Hollstein | 330/30 |
| 3,449,687 | 6/1969 | Knauber et al. | 330/30 |
| 3,469,112 | 9/1969 | Hands et al. | 307/238 |
| 3,581,226 | 5/1971 | Perkins et al. | 330/30 |
| 3,593,736 | 7/1971 | Hoffman | 137/110 |
| 3,600,609 | 8/1971 | Christensen | 307/279 |
| 3,610,965 | 10/1971 | Martin et al. | 307/279 |
| 3,622,902 | 11/1971 | Thomas | 330/30 |
| 3,643,235 | 2/1972 | Berger et al. | 307/238 |
| 3,644,838 | 2/1972 | Graf | 330/3 |
| 3,676,702 | 7/1972 | McGrogan, Jr. | 307/235 |
| 3,715,693 | 2/1973 | Fletcher | 307/230 |
| 3,747,077 | 7/1973 | Goser | 307/279 |
| 3,775,693 | 11/1973 | Proebsting | 330/35 |
| 3,870,901 | 3/1975 | Smith et al. | 307/304 X |

OTHER PUBLICATIONS

R. D. Lohman, "Application of Mosfets in Microelectronics," *Solid State Technology*, pp. 23–29, Mar. 1966.

*Primary Examiner*—R. V. Rolinec
*Assistant Examiner*—Lawrence J. Dahl
*Attorney, Agent, or Firm*—James M. Thomson; Wolmar J. Stoffel

[57] ABSTRACT

A dual channel high gain differential amplifier utilizing enhancement depletion MOS field effect transistors which exhibits high common mode rejection and fast switching characteristics.

2 Claims, 1 Drawing Figure

U.S. Patent  July 20, 1976  3,970,950
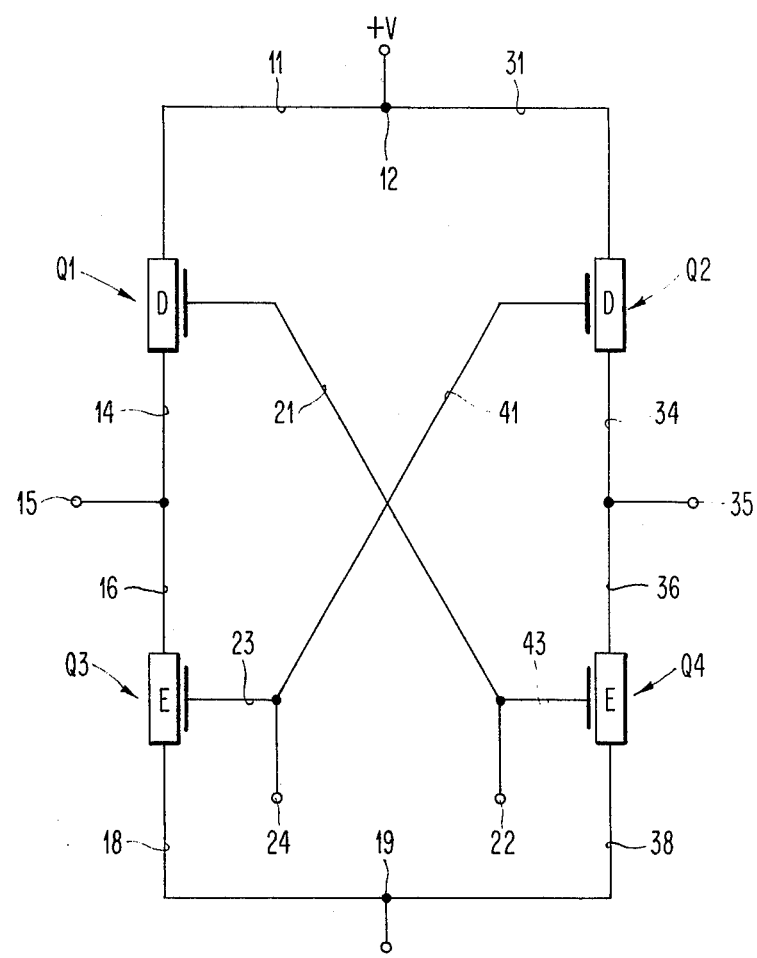

HIGH COMMON MODE REJECTION DIFFERENTIAL AMPLIFIER UTILIZING ENHANCEMENT DEPLETION FIELD EFFECT TRANSISTORS

BACKGROUND OF THE INVENTION

The present invention relates to a high quality, high gain dual channel differential amplifier exhibiting high common mode rejection characteristics. More particularly, the invention relates to such an amplifier fabricated as a large scale integrated circuit utilizing MOS field effect technology and specifically utilizing both enhancement mode and depletion mode devices upon an integrated chip.

Various electronic systems have been fabricated as large scale integrated circuits utilizing metal oxide semiconductor field effect transistors. This circuit technology includes the use of both P channel and N channel devices, as well as depletion mode and enhancement mode devices. However, for the most part, enhancement mode transistors have been utilized in such circuits in P channel configuration.

MOSFET circuits have been widely used with varying degrees of success in digital switching and amplification applications. However, a need still exists for circuitry providing high quality, high gain amplifier circuits which can be fabricated as large scale integrated circuits. In particular, a need exists in MOSFET technology for an amplifier exhibiting fast switching time in conjunction with high quality, high gain capability.

SUMMARY OF THE INVENTION

Accordingly, it is an object of the present invention to provide a high quality, high gain dual channel differential amplifier exhibiting high common mode rejection.

It is another object of the invention to provide such an amplifier which exhibits fast switching times as compared to prior art LSI circuits.

It is yet a further object of the invention to provide such a differential amplifier utilizing both enhancement and depletion mode devices.

These and other objects and features of the invention are achieved through a dual channel differential amplifier design wherein each channel is comprised of one depletion mode and one enhancement mode field effect transistor, with the drain and source of each device being effectively connected in series between a drain supply voltage and a source supply voltage. The dual outputs of the amplifier are taken from the common junctures of the transistor devices. The dual input terminals to the amplifier are each electrically connected to the gates of one enhancement and one depletion mode device, in cross-coupled fashion. This design leads to a high quality, high gain amplifier which exhibits high common mode rejection and provides enhanced switching times as is explained in detail hereinafter.

BRIEF DESCRIPTION OF THE DRAWING

The features and advantages of the invention are explained in detail hereinafter in conjunction with the accompanying drawing which comprises an electrical schematic diagram of the differential amplifier designed in accordance with the invention.

DETAILED DESCRIPTION OF THE INVENTION

Referring now to the drawings, the preferred embodiment of a high gain differential amplifier constructed in accordance with the invention is illustrated. The amplifier includes enhancement mode field effect transistor devices designated by the symbol E and depletion mode field effect transistors devices indicated by the symbol D. In the embodiment illustrated, it is envisioned that the enhancement and depletion mode devices both be of N channel configuration whereby the drain voltage is a positive voltage. However, it should be recognized that if desired, P channel devices can be utilized as well with a commensurate reversal of polarity of the voltages utilized in the circuit.

In well known fashion, the depletion mode devices of N channel configuration conduct whenever the gate to source voltage is greater than a negative threshold voltage that is characteristic of the device. In like fashion, the enhancement mode devices are conductive only when the gate to source voltage is greater than a positive threshold voltage that is characteristic of the device. This leads to certain advantages in switching time and interconnectability in the circuit disclosed as will become apparent hereinafter.

Referring specifically to the drawing, field effect transistors Q1 and Q3 are provided, each having a drain and a source terminal in the usual fashion and each being provided with a gate terminal. The drain of depletion mode transistor Q1 is electrically connected via a conductor 11 to a drain supply terminal 12 which is adapted to be connected to a positive DC source in order to provide the usual drain supply voltage. The source terminal of transistor Q1 is connected via a conductor 14 to an output terminal 15 of the amplifier circuit. Terminal 15 is likewise connected via a conductor 16 to the drain terminal of enhancement mode transistor Q3, and the source of Q3 is connected via a conductor 18 to a source voltage terminal 19 which is typically at ground level.

The gate of transistor Q1 is connected via the conductor 21 to an input terminal 22 of the amplifier circuit and the gate of transistor Q3 is connected via conductor 23 to an input terminal 24 of the amplifier circuit.

In similar fashion, a depletion mode field effect transistor Q2 is provided along with an enhancement mode field effect transistor Q4. As shown, transistors Q2, Q4, are respectively provided with drain and source terminals as well as gate terminals. As shown, the drain of Q2 is connected via a conductor 31 to drain supply terminal 12 and the source of Q2 is connected via a conductor 34 to an output terminal 35 of the amplifier. In similar fashion, the drain of transistor Q4 is connected via a conductor 36 to terminal 35 and the source of transistor Q4 is connected via a conductor 38 to terminal 19.

The gate of transistor Q2 is connected via a conductor 41 to input terminal 24 and the gate of transistor Q4 is connected via a conductor 43 to input terminal 22 of the amplifier in order to provide a cross-coupled configuration whereby each input of the amplifier is connected to one enhancement mode device and one depletion mode device.

In the configuration shown, transistors Q1, Q2, Q3, and Q4 are biased to a normally conductive state.

It should be apparent that the circuit illustrated will function as a high quality differential amplifier. Thus, if a more positive signal is applied to input terminal 24 the resulting more positive signals upon the gates of transistors Q3 and transistor Q2 tend to increase the conductivity of Q3 and Q2, respectively. In similar fashion, the simultaneous application of a less positive signal to input terminal 22 will provide corresponding less positive signals to the gates of transistors Q4, and Q1, respectively. This has the effect of decreasing the level of conduction of transistors Q1 and Q4.

Accordingly, with transistor Q1 becoming less conductive and transistor Q3 becoming more conductive, the voltage level at output terminal 15 becomes less positive or closer to the level of terminal 19. In similar fashion, with transistor Q2 becoming more conductive and transistor Q4 becoming less conductive, then the voltage level at output terminal 35 becomes more positive, i.e., it approaches the level of positive drain supply voltage of terminal 12. Accordingly, differential outputs occur at terminals 15, 35, respectively.

It should likewise be apparent that the amplifier, due to its cross-coupled characteristics, exhibits high common mode rejection. Thus, if the input signals to terminals 22, 24 move in the same direction, then the like changes in conductivity of transistors Q1 and Q3 and transistors Q2 and Q4 result in the nullifying of any change in the voltage level at output terminals 15, 35.

The circuit illustrated exhibits an enhanced, or faster switching time than a corresponding circuit utilizing only enhancement type devices since the load devices, Q1 and Q2, are directly driven by the input signal applied to terminals 22 and 24. A more positive signal applied to input terminal 24, simultaneously, with a less positive signal applied to input terminal 22, will result in the increased conductance of transistor Q2 and a decreased conductance of transistor Q4 rapidly driving output terminal 35 more positive. In a like manner, output terminal 15 is rapidly driven less positive by the simultaneous increase in conductance of Q3 and reduction in conductance of Q1. An all enhancement type circuit would be slower since in this case only transistors Q3 and Q4 would be driven by the input signal eliminating the contribution to the output signal due to the change in conductance of transistors Q1 and Q2. Therefore, an all enhancement device circuit similar to the circuit described herein would not be practical.

The circuit disclosed has the capability of permitting cascading of a multiplicity of similar circuits together in a chain with the output of the first circuit connected to the input of the second circuit, the output of the second circuit connected to the input of the third circuit, etc. This is due to the use of depletion devices for transistors Q1 and Q2 allowing the circuit to operate in the previously described manner with the average voltages at the input terminals 22 and 24 equal to the average voltages at the output terminals 15 and 35 permitting the direct connection of the output of one stage to the input of the next similar stage without the need to interpose special level shifting networks.

What is claimed is:
1. A differential amplifier comprising:
   a first depletion mode field effect transistor coupling a drain voltage terminal to a first output terminal, a second depletion mode field effect transistor coupling a drain voltage terminal to a second output terminal;
   a first enhancement mode field effect transistor coupling said first output terminal to a source voltage terminal and having a gate coupled to a first input terminal and a gate electrode of said second depletion mode transistor; and
   a second enhancement mode field effect transistor coupling a second output terminal to its source voltage terminal, and having a gate couple to a second input terminal and a gate electrode of said first depletion mode transistor.
2. A dual channel differential amplifier comprising:
   first and second enhancement mode field effect transistors coupled between a source voltage terminal and first and second output terminals, respectively;
   first and second depletion mode field effect transistors coupled between a drain voltage terminal and said first and second output terminals, respectively, thereby forming said dual channels; and
   circuit means cross-coupling the gate of each said depletion mode transistor to the gate of the enhancement mode transistor of an opposite one of said dual channels and to one of two input terminals whereby the depletion mode and enhancement mode transistors of a given channel of said amplifier will undergo opposite changes of conductance upon application of differential signals to said amplifier input terminals.

\* \* \* \* \*